United States Patent
Miyake et al.

(10) Patent No.: US 8,898,601 B2
(45) Date of Patent: Nov. 25, 2014

(54) LOGIC CIRCUIT DESIGN METHOD, LOGIC CIRCUIT DESIGN PROGRAM, AND LOGIC CIRCUIT DESIGN SYSTEM

(71) Applicant: Kabushiki Kaisha Toshiba, Tokyo (JP)

(72) Inventors: Masahisa Miyake, Tokyo (JP); Kenji Yoshida, Kanagawa-ken (JP); Kazumasa Nomura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/947,302

(22) Filed: Jul. 22, 2013

(65) Prior Publication Data
US 2014/0047400 A1    Feb. 13, 2014

(30) Foreign Application Priority Data

Jul. 23, 2012 (JP) ................................ 2012-163017
May 22, 2013 (JP) ................................ 2013-108384

(51) Int. Cl.
*G06F 17/50*    (2006.01)

(52) U.S. Cl.
CPC ................................. *G06F 17/505* (2013.01)
USPC ....................................................... 716/103

(58) Field of Classification Search
None
See application file for complete search history.

(56) References Cited

U.S. PATENT DOCUMENTS

| | | | |
|---|---|---|---|
| 6,173,435 B1 * | 1/2001 | Dupenloup | 716/104 |
| 6,658,628 B1 * | 12/2003 | Landy et al. | 716/103 |
| 6,836,877 B1 * | 12/2004 | Dupenloup | 716/103 |
| 7,134,106 B2 * | 11/2006 | Huang et al. | 716/105 |
| 7,500,205 B2 * | 3/2009 | Paul et al. | 716/132 |
| 7,962,886 B1 * | 6/2011 | Pandey et al. | 716/136 |
| 8,010,920 B2 * | 8/2011 | Bartolotti et al. | 716/106 |
| 8,042,085 B2 * | 10/2011 | Rahim et al. | 716/132 |
| 2006/0129961 A1 * | 6/2006 | Paul et al. | 716/6 |
| 2010/0064263 A1 * | 3/2010 | Rahim et al. | 716/2 |
| 2010/0153893 A1 * | 6/2010 | Bartolotti et al. | 716/5 |

FOREIGN PATENT DOCUMENTS

| | | |
|---|---|---|
| JP | 2001-297125 | 10/2001 |
| JP | 2003-216672 | 7/2003 |
| JP | 2008-226069 | 9/2008 |

\* cited by examiner

*Primary Examiner* — Leigh Garbowski
(74) *Attorney, Agent, or Firm* — Knobbe Martens Olson & Bear LLP

(57) ABSTRACT

According to one embodiment, a logic circuit design method of an embodiment includes generating logical data corresponding to register transfer level description, based on design data containing the register transfer level description, and generating constraint conditions designating circuit data which satisfies a predetermined condition among plural gate level circuit data logically equivalent to the logical data, based on the design data, and generating gate level circuit data based on the logical data under the constraint conditions.

15 Claims, 15 Drawing Sheets

FIG. 8

```
         RTL:                                RTL:
         always_comb begin                   input SEL_in, D1_in, D2_in;
           if (SEL == 1'b0) begin
             DO <= D1 ;                      always_ff @(posedge CLK1)
     A     end else begin                      D1 <= D1_in;
             DO <= D2 ;                        D2 <= D2_in;
           end                          C    end
         end
                                              always_ff @(posedge CLK1)
                                                SEL <= SEL_in;
         always_ff @(posedge CLK2)            end
         if (EN == 1'b1) begin
            Latch_DO <= DO;
     B   end else begin
            Latch_DO <= 8'b0
         end
```

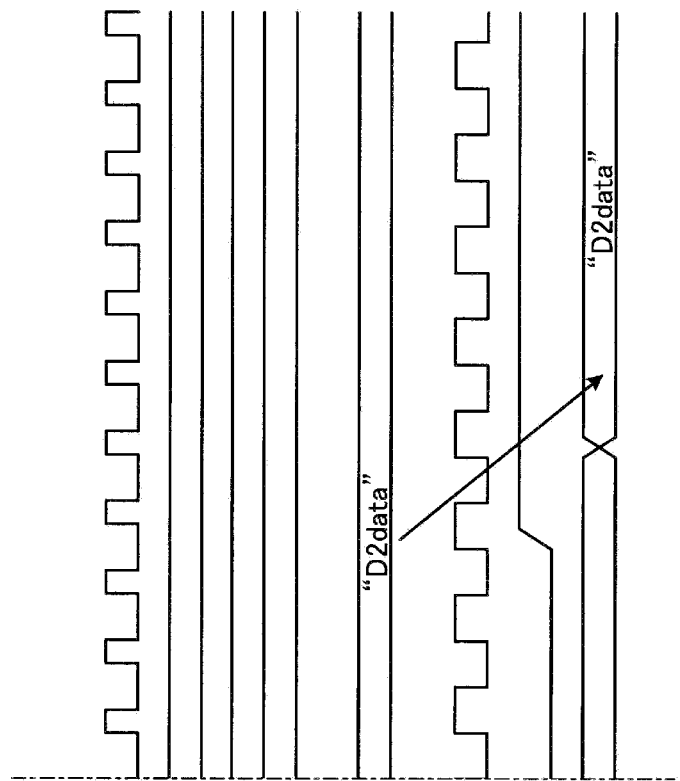
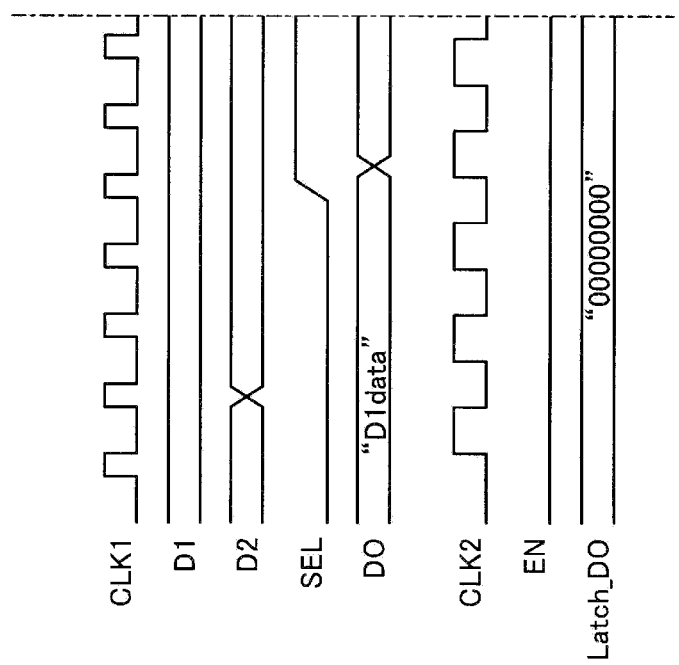
FIG. 9

```
RTL Description(sample1);
  input: DATA_ENABLE, DATA1_in, DATA2_in
  Output: TMP always_ff@(posedge CLK) begin
    if (DATA_ENABLE == 1'b1 && CALC_READY == 1'b0 ) begin
      CALC_READY <= 1'b1;
    end else begin
      CALC_READY <= 1'b0;
    end
  end
```
⎫
⎬ A
⎭

```
  ADDER_8bitADDER_8bit(
    .ADD_IN1(DATA1),
    .ADD_IN2(DATA2),
    .ADD_ANS(ADD_ANS)
  );
```
⎫
⎬ B
⎭

```
  always_ff@( posedge CLK) begin
    DATA1 <= DATA1_in;
    DATA2 <= DATA2_in;
  end
```
⎫
⎬ C
⎭

```
  always_ff@( posedge CLK) begin
    if ( CALC_READY == 1'b1 ) begin
      if ( ADD_ANS[8] == 1'b0 ) begin
        TMP <= DATA1[0];
      end else begin
        TMP <= DATA2[0];
      end
    end else begin
      TMP <= 1'b0;
    end
  end
```
⎫
⎬ D
⎭

```
module ADDER_8bit(
  input logic [7:0] ADD_IN1,
  input logic [7:0] ADD_IN2,
  output logic [8:0] ADD_ANS
);  //ADDER : 2cycle Multicycle_Logic
  assign ADD_ANS = ADD_IN1 + ADD_IN2;
endmodule
```
⎫
⎬ E
⎭

FIG. 17

LOGIC CIRCUIT DESIGN METHOD, LOGIC CIRCUIT DESIGN PROGRAM, AND LOGIC CIRCUIT DESIGN SYSTEM

CROSS-REFERENCE TO RELATED APPLICATIONS

This application is based upon and claims the benefit of priority from the prior Japanese Patent Application No. 2012-163017, filed Jul. 23, 2012; and No. 2013-108384, filed May 22, 2013, the entire contents of which are incorporated herein by reference.

FIELD

Embodiments described herein relate generally to a logic circuit design method, a logic circuit design program, and a logic circuit design system.

BACKGROUND

Logic synthesis CAD (computer-aided design) as a software tool to synthesize circuit data on actual transistor cell level, based on source code prepared by a designer, is used in digital logic circuit design using an electronic computer. The designer first prepares the source code by using a hardware description language (HDL) for description of circuit operation on level (or design abstraction level) called RTL (Register Transfer Level). This is termed RTL design, and, in the RTL design, the circuit operation is formed of combinations of flows of signals (or data transfer) from one to another of registers (e.g. flip-flops or the like) and their corresponding logic operations. The circuit data (or a net list) on the actual transistor cell level is created (or synthesized) by the logic synthesis CAD, based on operation description in the source code of the RTL design.

The logic synthesis CAD first performs conversion from the source code of the RTL design to gate-level intermediate data representing a logical expression corresponding to the source code. Mapping from gate level to transistor cell level (or technology library mapping) is performed based on the intermediate data, by using a technology library which predefines a gate circuit or a flip-flop provided by a semiconductor vendor. After that, transistor cell level circuit data is created through optimization for processing speed, circuit rightsizing, or the like, further by eliminating an unnecessary transistor cell or doing the like.

Although there may generally exist plural pieces of transistor cell level circuit data logically equivalent to the logical expression corresponding to the source code of the RTL design mentioned above, the logic synthesis CAD creates one of the plural pieces of transistor cell level circuit data through the above-described technology library mapping and optimization. However, the conventional logic synthesis CAD, although it can achieve optimization for circuit size, operating speed or power consumption, has no means for conveying designer's intention to the logic synthesis CAD, in a case where a CDC (Clock Domain Crossing) circuit in a system in which two or more clocks occur, or a multi-cycle path circuit designed with a longer cycle than a cycle of a specified clock, or the like is an object to be designed. Therefore, transistor cell level circuit data which is contrary to the designer's intention may possibly be synthesized. In other words, gate level circuit data which is logically equivalent but does not reflect the intent of design may be synthesized. As a result, there arises the problem of causing a circuit malfunction.

BRIEF DESCRIPTION OF THE DRAWINGS

FIG. 8 shows a representation of source code in the third embodiment;

FIG. 9 is a time chart illustrating a signal timing chart according to the third embodiment;

FIG. 17 shows a representation of source code in the fourth embodiment;

DETAILED DESCRIPTION

In general, according to one embodiment, a logic circuit design method includes generating logical data corresponding to register transfer level description, based on design data containing the register transfer level description, and generating constraint conditions designating circuit data which satisfies a predetermined condition among plural gate level circuit data logically equivalent to the logical data, based on the design data, and generating gate level circuit data based on the logical data under the constraint conditions.

Logic circuit design methods, logic circuit design programs and logic circuit design systems according to embodiments will be described in detail below with reference to the accompanying drawings. Incidentally, it is to be understood that the embodiments are not intended to limit the scope of the invention.

[First Embodiment]

Figure 1:
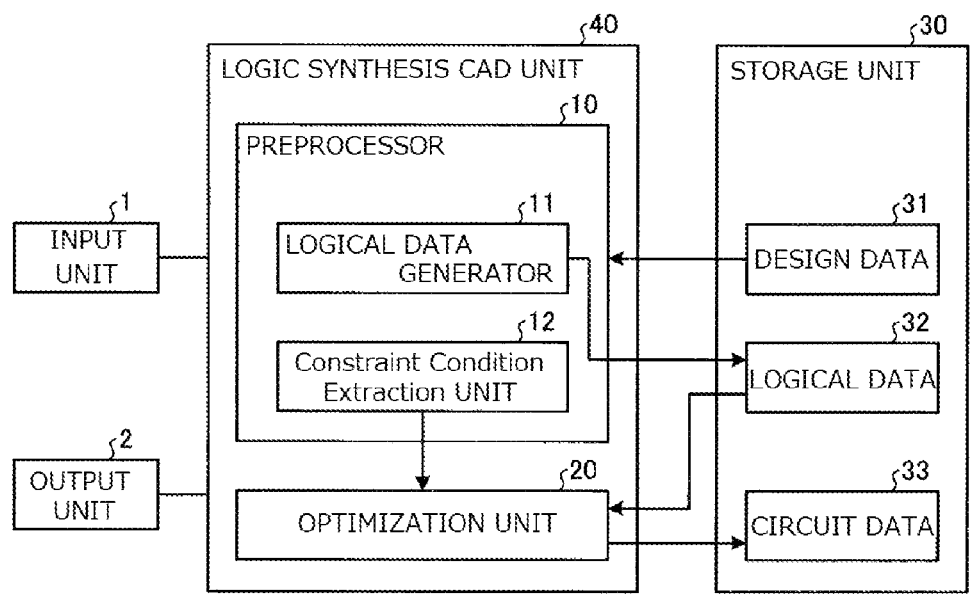
FIG. 1 is a drawing illustrating a configuration of a logic circuit design system according to a first embodiment.
Figure 20:
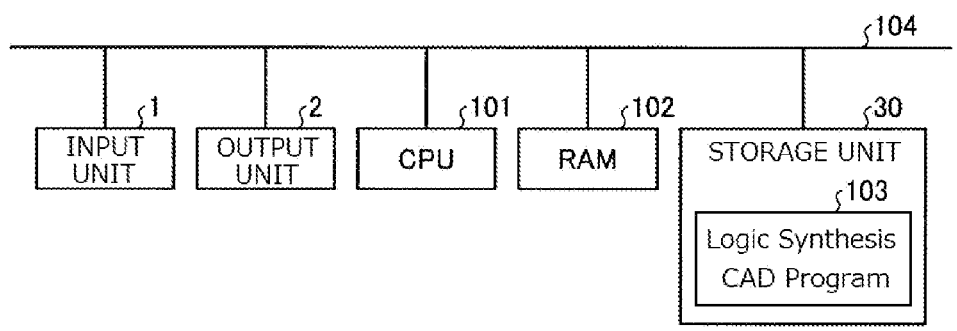
FIG. 20 is a drawing illustrating a configuration of hardware which implements the logic circuit design systems according to the embodiments.

FIG. 1 is a drawing illustrating a configuration of a logic circuit design system. 100 according to a first embodiment. The logic circuit design system 100 includes a logic synthesis CAD unit 40 which is implemented by CAD software which runs on an electronic computer, an input unit 1 such as a mouse or a keyboard, an output unit 2 such as a display, and a storage unit 30 as a storage device such as an HDD (hard disk drive) or a flash memory. The logic circuit design system 100 is implemented by the electronic computer such as a personal computer. A configuration of hardware which implements the logic circuit design system 100 is illustrated in FIG. 20. The input unit 1, the output unit 2, a CPU (central processing unit) 101, RAM (random access memory) 102 and the storage unit 30 are connected through a bus 104. As illustrated in FIG. 20, the storage unit 30 stores a logic synthesis CAD program 103 as a logic circuit design program. The CPU 101 loads the logic synthesis CAD program. 103 as a program module into the RAM. 102, and the loaded program module is executed by the CPU 101 thereby to function as the logic synthesis CAD unit 40 of FIG. 1. Incidentally, the logic synthesis CAD program 103 in the storage unit 30 is not illustrated in FIGS. 1, 5, 7 and 16 for sake of simplicity.

The logic synthesis CAD unit 40 divides a logical expression corresponding to RTL source code (hereinafter sometimes called merely RTL or RTL description) into logic parts as given below: combinational logic of random logic and hold logic of a flip-flop latch, and maps the described logic to an actual circuit library. The logic synthesis CAD unit 40 includes a preprocessor 10 and an optimization unit 20. The preprocessor 10 receives input of circuit design data 31 containing the RTL description as the source code which describes register level operation, and outputs logical data corresponding to the RTL description, and constraint conditions. The logical data 32 is gate level circuit data representing the logical expression corresponding to the RTL source code. The constraint conditions designate circuit data which satisfies a predetermined condition among plural pieces of gate level circuit data logically equivalent to the logical data 32.

The preprocessor 10 includes a logical data generator 11 and a constraint-condition extraction unit 12. The logical data generator 11 generates the logical data 32 corresponding to the RTL description, based on the design data 31. The constraint-condition extraction unit 12 outputs the constraint conditions designating the circuit data which satisfies the predetermined condition among the plural pieces of gate level circuit data logically equivalent to the logical data 32. At the time of constraint extraction, the constraint-condition extraction unit 12 may extract the constraint conditions based on the RTL description contained in the design data 31, based on information other than the RTL description, such as timing constraint information, contained in the design data 31, or based on the logical data 32 corresponding to the RTL description. The optimization unit 20 generates gate level circuit data 33 based on the logical data 32 under the constraint conditions outputted by the constraint-condition extraction unit 12. The circuit data 33 is data representing relative connections on transistor cell level and is sometimes called a net list. Incidentally, the design data 31, the logical data 32 and the circuit data 33 are held in the storage unit 30.

Figure 2:
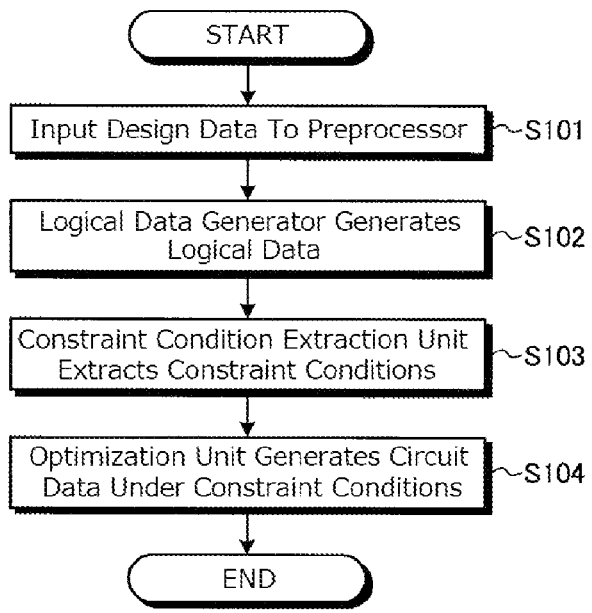
FIG. 2 is a drawing illustrating a flowchart of a logic circuit design method according to the first embodiment.

FIG. 2 illustrates a flowchart of a logic circuit design method by the logic circuit design system 100. First, the circuit design data 31 containing the RTL description is inputted to the preprocessor 10 (at step S101). Here, the design data 31 contains RTL description as given for example in the following section "Example 1 of RTL description." Incidentally, RTL descriptions will hereinafter be all described as Verilog descriptions by way of example.

[Example 1 of RTL Description]

```
if(EN==1'b1) begin
    if(SEL==1'b0) begin
        Z<=D1;
    end else begin
        Z<=D2;
    end
end else begin
    Z<=1'b0
End
```

In the above RTL description, the condition "EN==1'b1" in if statement on the first line executes the following if an enable signal EN is a 1-bit signal and takes the value "1" ("1'b" indicates the 1-bit signal).

```
if(SEL==1'b0) begin
    Z<=D1;
end else begin
    Z<=D2;
end
```

In other words, if a signal SEL is a 1-bit signal and takes the value "0," D1 is assigned to Z (Z<=D1), or otherwise, D2 is assigned to Z (Z<=D2).

Then, in a case where the enable signal EN is the 1-bit signal and takes a value other than "1" (or in a case where the enable signal EN is the 1-bit signal and takes the value "0"), the following is executed.

Z<=1'b0

In other words, this indicates that the value "0" of the 1-bit signal is assigned to Z.

Figure 3:
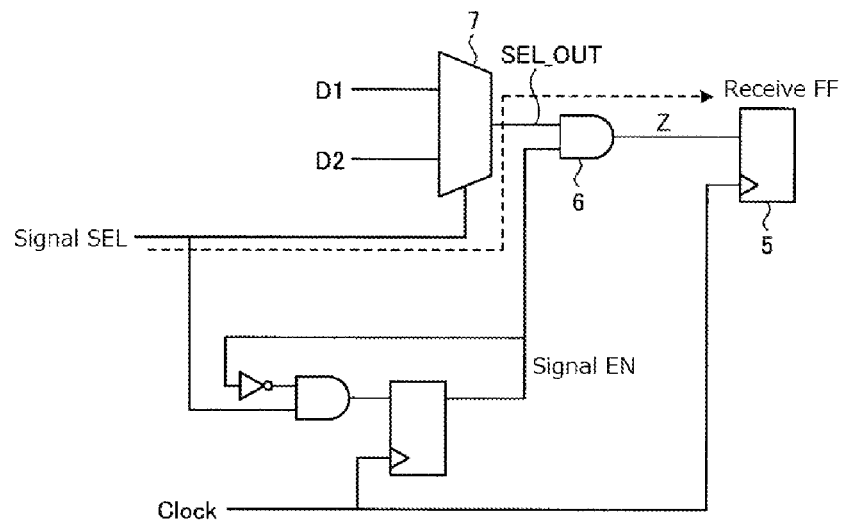
FIG. 3 is a diagram illustrating a designer's intended circuit configuration in the first and a second embodiments.

In summary, the description in the foregoing section "Example 1 of RTL description" is intended to assign the value D1 or D2 to Z, depending on the value of the signal SEL, if the enable signal EN is the 1-bit signal and takes the value "1," or to assign the value "0" of the 1-bit signal to Z in a case where the enable signal EN takes the value other than "1" (or equivalently, "0"). A designer who has written such RTL description typically intends to synthesize a circuit configuration including a flip-flop 5, an AND gate 6, and a selector 7, as illustrated in FIG. 3. In other words, the designer intends that a signal of a resultant value obtained by the AND gate 6 ANDing an output from the selector 7 with the enable signal EN be inputted to the flip-flop 5.

Then, the logical data generator 11 generates the logical data 32 corresponding to the RTL description contained in the design data 31 (at step S102). The logical data 32 corresponding to the above RTL description is expressed by Equation (1):

$$Z = EN \cdot (D1 \cdot SEL' + D2 \cdot SEL) \qquad (1)$$

where SEL' indicates the NOT of SEL.

As mentioned previously, the design data 31 given by "Example 1 of RTL description" is created based on the circuit designer's intent of design to input the signal of the resultant value obtained by the AND gate 6 ANDing the output from the selector 7 with the enable signal EN to the flip-flop 5. Such intent of design is expressed by description of a nest (or a nest for "if(EN==1'b1)" and the following) of the outermost if statement of "Example 1 of RTL description." However, the conventional logic synthesis CAD creates transistor cell level circuit data representing the logical expression of Equation (1), by optimization to be mentioned later, without understanding such intent of design.

Therefore, the logic synthesis CAD unit 40 according to the first embodiment explicitly extracts such intent of design. Specifically, information contained separately in the design data 31 by some explicit means, such as by utilizing signal clock information, by appending additional description to the RTL description, or by utilizing timing information aside from the RTL description, is utilized in order to extract such intent of design.

Then, the constraint-condition extraction unit 12 extracts constraint conditions on a circuit based on the above-mentioned intent of design, based on the design data 31 or the logical data 32 determined from the design data 31 (at step S103). The constraint conditions extracted here are that a circuit configuration in which the signal obtained by ANDing the output from the selector 7 with the enable signal EN is inputted to the flip-flop 5 is fixed so that optimization after this does not change that portion.

Figure 4:
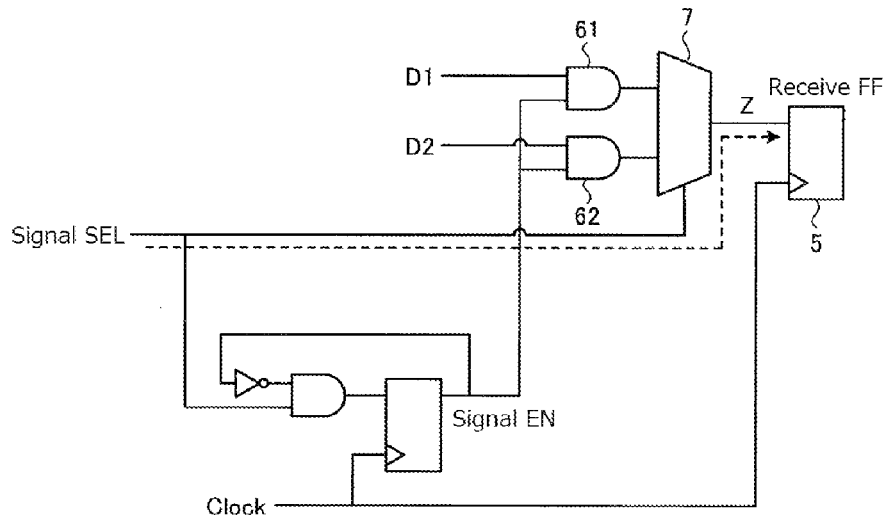
FIG. 4 is a diagram illustrating a circuit configuration which is contrary to designer's intention, in the first and the second embodiments.

Finally, the optimization unit 20 generates the circuit data 33 by performing optimization taking processing speed or circuit size into account, by using a technology library which predefines a gate circuit or a flip-flop provided by a semiconductor vendor, under the extracted constraint conditions (at step S104). The optimization unit 20 generates the circuit data 33 as illustrated in FIG. 3, as transistor level circuit data logically equivalent to the logical data 32 represented by Equation (1), under the extracted constraint conditions. The transistor level circuit data logically equivalent to the logical data 32 represented by Equation (1) include circuit data as illustrated in FIG. 4. According to the first embodiment, however, the circuit data 33 as illustrated in FIG. 3, which reflects the intent of design, is generated based on the constraint conditions.

Heretofore, there has been no way of writing description of preconditions for design at the stage of writing of RTL description for circuit design, which in turn has made it impossible for logic synthesis from RTL to reflect designer's intention regarding what kind of circuit data is to be created, insofar as the circuit data is logically equivalent and does not violate constraints on the logic synthesis. According to the first embodiment, however, circuit constraint conditions are generated based on the circuit design data. Optimization by the logic synthesis CAD to generate gate level circuit data from the logical data corresponding to the register transfer level description under the circuit constraint conditions is performed. As a result, the effect of generating the circuit data which reflects the circuit designer's intent of design can be achieved.

In second to fourth embodiments given below, more specific description will be given with regard to other embodiments. Incidentally, also in the second to fourth embodiments, in the same manner as the first embodiment, the CPU 101 of FIG. 20 loads the logic synthesis CAD program 103 as the program module into the RAM 102, and the loaded program module is executed by the CPU 101 thereby to function as a logic synthesis CAD unit 40A (see FIG. 5), 40B (see FIG. 7) or 40C (see FIG. 16).

[Second Embodiment]

In logic circuit design, an asynchronous path or an exceptional location where a timing path does not converge within a cycle specified by a clock in a synchronizing circuit may be present. In such a case, the designer uses a control signal which ensures that timing is satisfied within a cycle, for an unexceptional location. Then, the designer writes RTL description of a circuit in which a location to be treated as asynchronization or an exception is interrupted so as not to propagate into a logical block in the following stage. Specifically, the designer may write RTL source code with the intention of finally using the enable signal EN to specify output timing, assuming that a change in the enable signal EN as the control signal lags one cycle behind a change in the value of the signal SEL. One example is "Example 1 of RTL description" mentioned above.

In logic circuit data described in "Example 1 of RTL description," designer's intended circuit data is gate level circuit data as illustrated in FIG. 3. The logical expression of the signal Z outputted by the AND gate 6 and inputted to the flip-flop 5 according to this circuit configuration is represented as Equation (1).

In the example of FIG. 3, a condition for the input signal to the flip-flop 5 is that the change in the enable signal EN occurs on the rising edge of the first clock after the change in the value of the signal SEL. In other words, a circuit is such that the input to the flip-flop 5 can be restricted by the enable signal EN.

However, there has heretofore been no way of writing description of preconditions for design at the stage of writing of RTL source code for circuit design. Therefore, logic synthesis from the RTL source code is performed without consideration for the timing of signal change in the process of the logic synthesis, insofar as circuit data is logically equivalent and does not violate constraints on the logic synthesis. As a result, a circuit as given below may possibly be synthesized; specifically, in the circuit, the control signal is not dominant at the time of passing of a signal from one to another of logic circuits of an asynchronous clock, or the like situation arises, which in turn leads to propagation of a signal which changes at the time that is contrary to the intention of the circuit designer who has written the RTL source code.

Specifically, in the logic circuit data described in "Example 1 of RTL description," gate level circuit data which is different from the designer's intention, as illustrated in FIG. 4, may be generated by the logic synthesis CAD. This is due to the fact that the circuit data as illustrated in FIG. 4 is also logically equivalent to the logical expression corresponding to "Example 1 of RTL description," as mentioned below. The logical expression of the signal Z outputted by the selector 7 and inputted to the flip-flop 5 according to a circuit configuration of FIG. 4 is represented as the following equation and is logically equivalent to the signal Z of FIG. 3.

$$Z=(EN \cdot D1) \cdot SEL'+(EN \cdot D2) \cdot SEL=EN \cdot (D1 \cdot SEL'+D2 \cdot SEL)$$

In other words, in the gate level circuit data of FIG. 4, a layout is such that the signal SEL is inputted to the following stage after the enable signal EN, as opposed to the designer's intent of the RTL description. In other words, the circuit configuration is such that, although the gate level circuit data of FIG. 4 is logically equivalent to the gate level circuit data of FIG. 3, the signal SEL is inputted to the flip-flop 5 without restriction by the enable signal EN.

Figure 5:
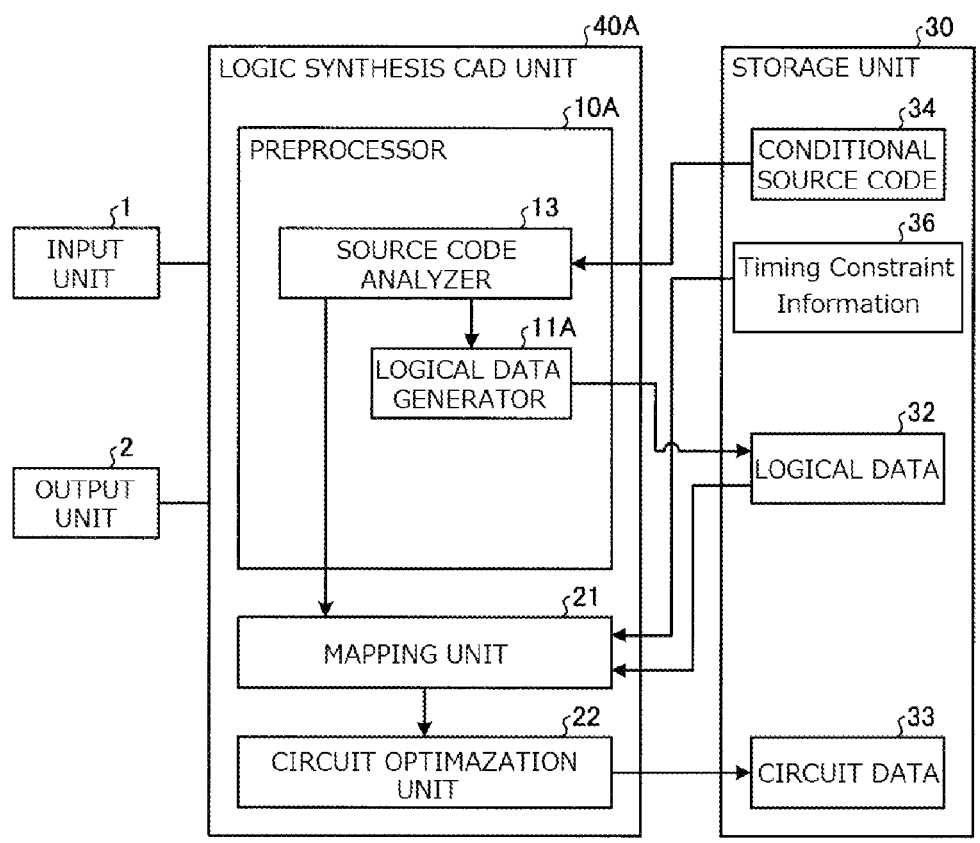
FIG. 5 is a drawing illustrating a configuration of a logic circuit design system according to the second embodiment.

FIG. 5 is a drawing illustrating a configuration of a logic circuit design system 200 according to the second embodiment. In the second embodiment, conditional source code 34 and timing constraint information 36 correspond to the design data 31 of FIG. 1. A preprocessor 10A includes a source code analyzer 13 and a logical data generator 11A. The source code analyzer 13 includes the function of the constraint-condition extraction unit 12 of FIG. 1, and also performs syntax checks on an RTL design language, or the like, for example. A mapping unit 21 and a circuit optimization unit 22 correspond to the optimization unit 20 of FIG. 1. The mapping unit 21 performs mapping from gate cell level to transistor cell level (or technology library mapping) by using a technology library which predefines a gate circuit or a flip-flop provided by a semiconductor vendor. The circuit optimization unit 22 generates the circuit data 33 by performing optimization for processing speed, circuit rightsizing, or the like, by eliminating an unnecessary transistor cell or doing the like. The conditional source code 34 provides description of operation of the flip-flop 5 of FIG. 3, as given below, for example.

```
//receive FF
always(posedge@Clock)
#pragma(EN&SEL_OUT)
if(EN==1'b1) begin
    Z<=SEL_OUT;
end else begin
    Z<=1'b0;
End
assign SEL_OUT=SEL?D2:D1;
```

In the above conditional source code 34, the portion "always(posedge@Clock)" through "End" defines the AND gate 6 of FIG. 3. The statement "always(posedge@Clock)" is a statement for execution of "always(posedge@Clock)" through "End" at every rising edge of Clock. Then, the following line "#pragma(EN&SEL_OUT)" is a condition added to the source code. Addition of this line to the source code 34 enables the source code analyzer 13 to extract a condition that a logical product (&) of the enable signal EN and a different signal SEL_OUT be set as a hold value of the flip-flop 5.

The logical data generator 11A functions as a compiler to compile the RTL description into the logical data 32. The line "#pragma(EN&SEL_OUT)" is interpreted by the source code analyzer 13 corresponding to the preprocessor before compilation, and is ignored at the time of conversion of the RTL description into the logical data 32. In this manner, the designer embeds the condition based on the intent of design in the RTL description. Incidentally, the notation "#pragma" is the notation for the preprocessor in C language, which is cited byway of example, and it is to be understood that a method for representing the condition based on the intent of design in the RTL description is not so limited.

The description "if(EN==1'b1) begin" through "End" after "#pragma(EN&SEL_OUT)" indicates that if the enable signal EN is a 1-bit signal and takes the value "1," SEL_OUT is assigned to Z (Z<=SEL_OUT), and otherwise, the value "0" of the 1-bit signal is assigned to Z (Z<=1'b0).

After that, a null line is entered, and thereafter, the portion "assign SEL_OUT=SEL?D2:D1;" defines the selector 7. This indicates that in a case where SEL is true (1), SEL_OUT is D2, and in a case where SEL is false (0), SEL_OUT is D1. In other words, this indicates SEL_OUT=D1·SEL'+D2·SEL. Therefore, the portion "assign SEL_OUT=SEL?D2:D1;" has the same meaning as the following description.

```
if(SEL==1'b0) begin
    SEL_OUT<=D1;
end else begin
    SEL_OUT<=D2;
end
```

Incidentally, the reason why the designer has the intention of design such that the input to the flip-flop 5 is restricted by the enable signal EN, as the designer has written the description "#pragma(EN&SEL_OUT)," is because, in FIG. 3, SEL_OUT as the output signal from the selector 7 is a signal having a multi-cycle timing constraint. In other words, the enable signal EN is ANDed (or subjected to the AND gate) with SEL_OUT as a multi-cycle path. The timing constraint information 36 as information on such a constraint on the timing of the multi-cycle path is also provided to the logic synthesis CAD unit 40A.

Figure 6:
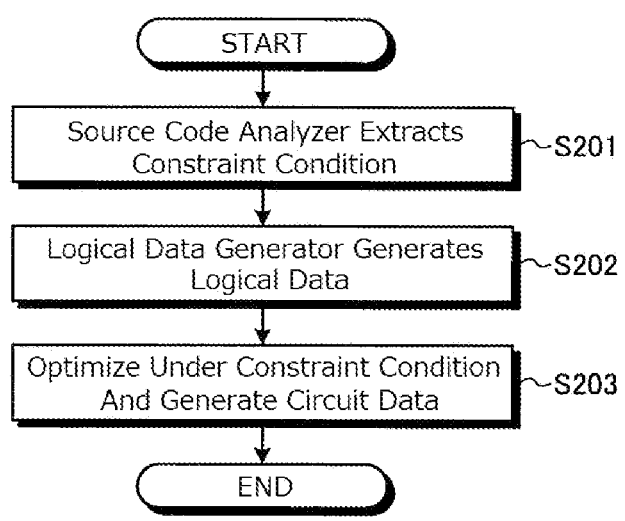
FIG. 6 is a drawing illustrating a flowchart of a logic circuit design method according to the second embodiment.

FIG. 6 illustrates a flowchart of a logic circuit design method by the logic circuit design system 200. First, the source code analyzer 13 interprets the portion "#pragma (EN&SEL_OUT)" from the conditional source code 34 thereby to extract a constraint condition that the logical product (&) of the enable signal EN and the different signal SEL_OUT be set as the hold value of the flip-flop 5 (at step S201). As mentioned above, here, the source code analyzer 13 functions as a kind of preprocessor. Then, the logical data generator 11A generates the logical data 32, based on the conditional source code 34 exclusive of "#pragma (EN&SEL_OUT)" (at step S202). Here, the source code analyzer 13 directs the logical data generator 11A to generate the logical data 32 in a form such that the enable signal EN and the signal SEL_OUT are ANDed, based on the above-mentioned constraint condition. In other words, the source code analyzer 13 directs the logical data generator 11A to generate the logical data 32 in the form of EN·(D1·SEL'+D2·SEL) rather than (EN·D1)·SEL'+(EN·D2)·SEL.

Further, under a condition that a portion for the AND of the enable signal EN and the signal SEL_OUT be fixed as the AND gate 6, designated by the source code analyzer 13, the mapping unit 21 performs mapping to transistor cell level, and the circuit optimization unit 22 performs optimization thereby to generate the circuit data 33 corresponding to FIG. 3 (at step S203). Incidentally, for generation of the circuit data 33, the timing constraint information 36 is also inputted to the mapping unit 21, and the optimization is performed taking the timing constraint information 36 into account.

According to the second embodiment, the source code analyzer 13 extracts a constraint condition which reflects the intent of design, from the conditional source code, and optimization of circuit data by the logic synthesis CAD is performed under the constraint condition. As a result, the circuit data which reflects the intent of design can be obtained.

[Third Embodiment]

Figure 7:
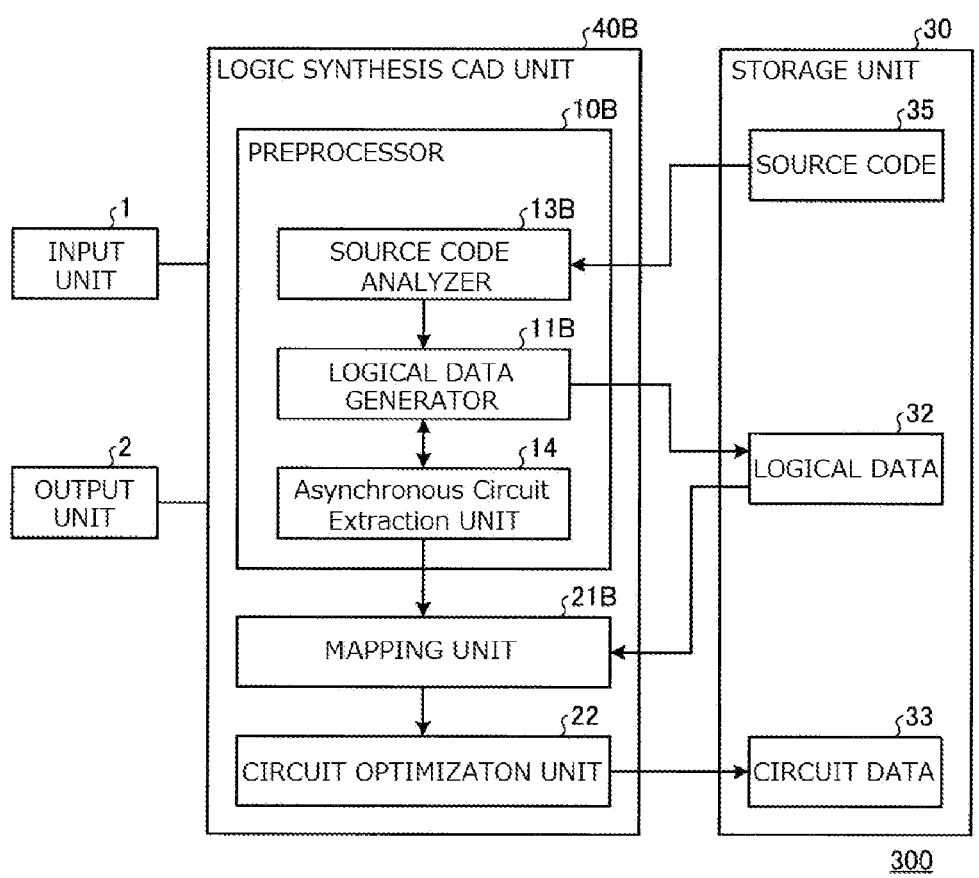
FIG. 7 is a drawing illustrating a configuration of a logic circuit design system according to a third embodiment.

FIG. 7 is a drawing illustrating a configuration of a logic circuit design system 300 according to the third embodiment. In the third embodiment, a preprocessor 10B includes a source code analyzer 13B, a logical data generator 11B, and an asynchronous circuit extraction unit 14. Source code 35 corresponds to the design data 31 of FIG. 1, and the asynchronous circuit extraction unit 14 corresponds to the constraint-condition extraction unit 12 of FIG. 1. A mapping unit 21B and the circuit optimization unit 22 correspond to the optimization unit 20 of FIG. 1 and have their respective functions which are the same as those of the second embodiment.

A circuit represented by RTL description in FIG. 8 is an example of a circuit including a CDC (Clock Domain Crossing) circuit in which passing of data from one to another of logical blocks driven by two clocks CLK1 and CLK2, respectively, occurs. The enable signal EN is driven by CLK2, and the intent of RTL design is to capture data "D0" in the flip-flop which holds the value of "Latch_D0," when the enable signal EN takes the value "1" (EN="1"), which indicates the time at which data is valid. Otherwise, or at the time at which EN="0," it is requested that the value of "Latch_D0" be always fixed at an 8-bit value "0," as illustrated in a signal timing chart of FIG. 9.

Figure 10:
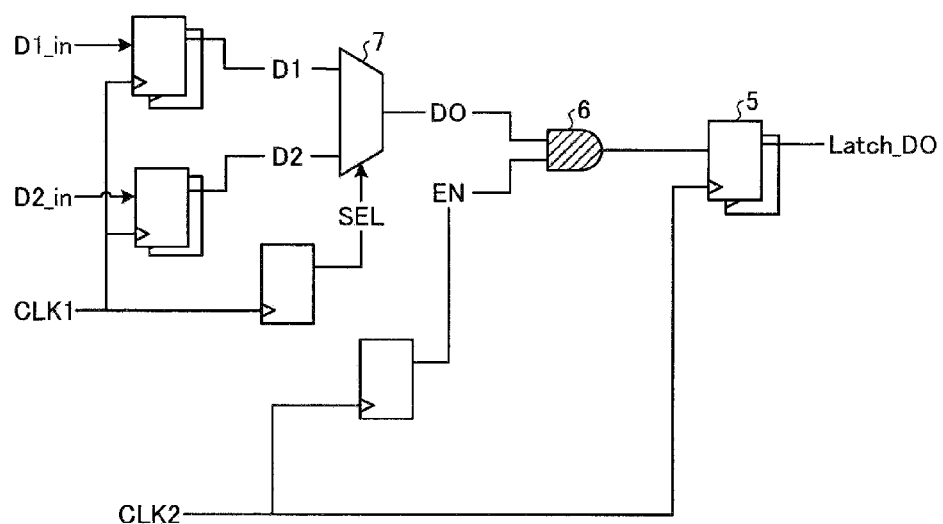
FIG. 10 is a diagram illustrating a designer's intended circuit configuration in the third embodiment.

In such a case, it is a circuit as illustrated in FIG. 10 that is intended by the designer who has written the RTL description of FIG. 8. In an example of FIG. 10, as represented by the RTL description, the enable signal EN is mapped to the AND gate 6 immediately before the flip-flop 5 which holds the value of "Latch_D0." Thereby, at the time at which the enable signal EN="0," a signal inputted to "Latch_D0" always has the 8-bit value "0." The value of "Latch_D0" is expressed by the following logical expression.

$$\text{Latch\_D0}=EN\cdot(D1\cdot SEL'+D2\cdot SEL)$$

Figure 11:
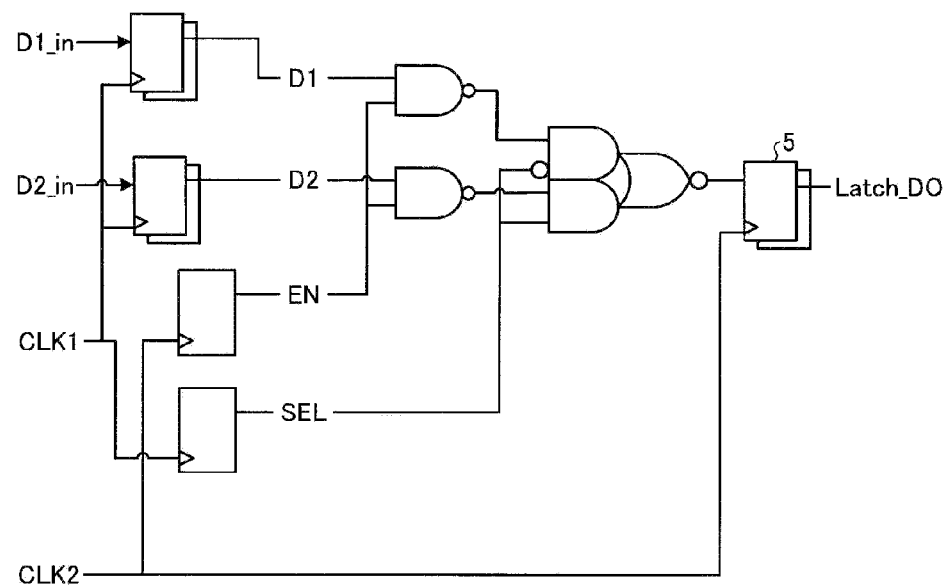
FIG. 11 is a diagram illustrating a circuit configuration which is contrary to designer's intention, in the third embodiment.

Since $EN\cdot(D1\cdot SEL'+D2\cdot SEL)=((EN\cdot D1)'\cdot SEL'+(EN\cdot D2)'\cdot SEL)'$, however, the conventional logic synthesis CAD may possibly synthesize a circuit as illustrated in FIG. 11, which reflects a logical form of $Latch\_D0=((EN\cdot D1)'\cdot SEL'+(EN\cdot D2)'\cdot SEL)'$.

Figure 12:
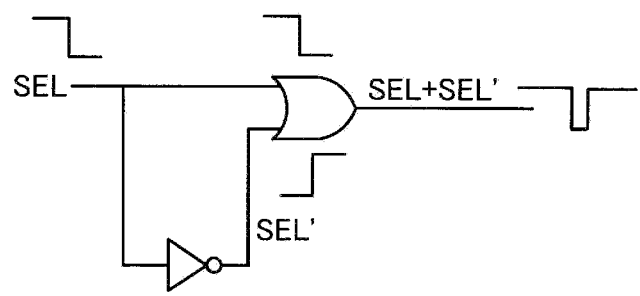
FIG. 12 is a diagram illustrating the state of occurrence of a glitch which is contrary to designer's intention, in the third embodiment.

However, assuming EN="0" leads to $Latch\_D0=(SEL'+SEL)'$, although $Latch\_D0=((EN\cdot D1)'\cdot SEL'+(EN\cdot D2)'\cdot SEL)'$ represented in FIG. 11 is equivalent to FIG. 10 in terms of the logical expression. In this case, $(SEL'+SEL)'=0$ is obtained in logical terms; however, in an actual circuit, there may be a time lag between the time at which the signal SEL changes and the time at which a signal SEL' as an inverted signal of the signal SEL changes, which in turn may lead to a period of time during which SEL'+SEL cannot be maintained at "1" and hence becomes "0." In other words, as illustrated in FIG. 12, the occurrence of signal change in the signal SEL may cause a glitch such that $Latch\_D0=(SEL'+SEL)'="1"$ in the length of the period of time depending on the above-mentioned time lag. Consequently, this may result in a period of time during which the value of "$Latch\_D0$"$=(SEL'+SEL)'$ cannot be maintained at "0."

A cause of this problem lies in the fact that, even though the designer has written the RTL description so that the enable signal EN as the control signal is inputted to the logic circuit immediately before Latch_D0, the conventional logic synthesis CAD performs optimization of the logical expression, as opposed to the intent of design, as a result of optimization of timing, area, or the like, thereby to synthesize a circuit which does not reflect the intent.

In order to solve the above-mentioned problem, the logic circuit design system 300 maintains blocks of the source code 35 written at the stage of RTL design, as virtual groups for logic synthesis. Then, a location which is not a CDC perfectly-synchronizing circuit, in logical blocks in each of the groups, is estimated, and the location is separated and fixed, and thereby, the logic synthesis which is contrary to the designer's intention is prevented from being performed. As employed herein, the block refers to a range of "begin" through "end" in always statement, a range to a semicolon ";" in assign statement, or the like, for example in the case of Verilog description. The asynchronous circuit extraction unit 14 of the logic circuit design system 300 according to the third embodiment extracts the above-mentioned intent of design from the source code 35.

Figure 13:
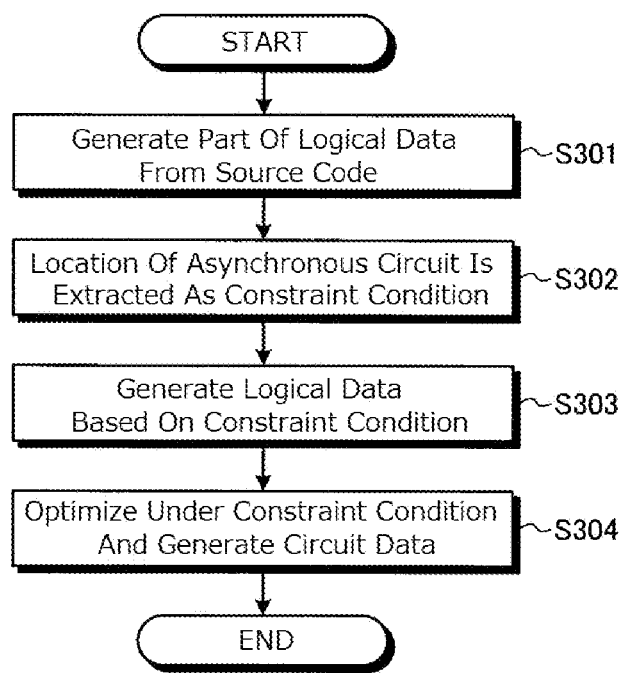
FIG. 13 is a drawing illustrating a flowchart of a logic circuit design method according to the third embodiment.
Figure 14:
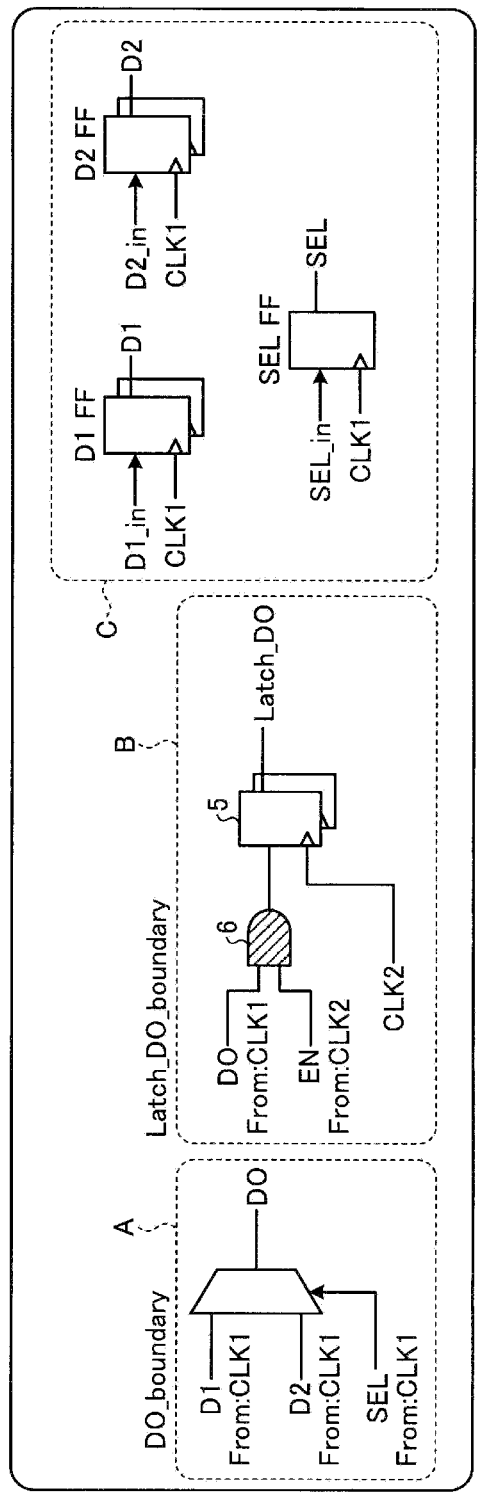
FIG. 14 is a diagram illustrating the state of logical data for each of fragmented portions in the third embodiment.

Next, a logic circuit design method by the logic circuit design system 300 according to the third embodiment will be described with reference to FIGS. 7, 8, 13 and 14. FIG. 13 is a chart illustrating a flowchart of the logic circuit design method by the logic circuit design system 300. First, the source code 35 illustrated in FIG. 8 undergoes syntax check or the like by the source code analyzer 13B and is separated into plural blocks. For each of the blocks, the logical data generator 11B performs conversion to a logic cell for each of fragmented portions as illustrated in FIG. 14 (at step S301). Here, the conversion is performed not on the whole of the final logical data 32 but on part of the logical data 32, which is logical data, created at the previous stage, for each of the fragmented portions for each of the groups.

In other words, the logic synthesis CAD unit 40B analyzes all RTL descriptions in the source code 35, forms virtual groups according to blocks of the RTL descriptions, and performs conversions to logic cells for the logic synthesis CAD, on logical blocks written in the virtual groups. Also, at this time, the conversions to the logic cells are performed according to the order of priority of the RTL descriptions. For example in the case of if statement, the conversions to the logic cells are performed so that the outermost nest becomes the last stage of a circuit.

Specifically, a block A of the RTL description of FIG. 8 is converted to a group A as a portion of the logical data of FIG. 14, a block B of the RTL description of FIG. 8 is converted to a group B as a portion of the logical data of FIG. 14, and a block C of the RTL description of FIG. 8 is converted to a group C as a portion of the logical data of FIG. 14.

Incidentally, as illustrated in FIG. 14, the logical data for each of the fragmented portions for each of the groups, generated here, also contains information on the clocks which drive the signals. The asynchronous circuit extraction unit 14 extracts a group in which plural signals driven by plural different clocks, respectively, are inputted together, in the logical data for each of the portions. In other words, the asynchronous circuit extraction unit 14 extracts a group having an asynchronous circuit which is not a perfectly-synchronizing circuit, as a constraint condition that a circuit configuration be fixed in optimization after this (at step S302). In other words, in the block B of FIG. 14, a constraint condition that a signal D0 driven by CLK1 and the enable signal EN driven by CLK2 be inputted to the AND gate 6 to be inputted to the flip-flop 5 is extracted. Therefore, the constraint condition contains information on the location of the asynchronous circuit in which the plural signals driven by the plural different clocks, respectively, coexist together. Specifically, for the group B including plural logical blocks operated by CLK1 and CLK2 as the plural clocks among the groups of the logical data for each of the fragmented portions illustrated in FIG. 14 mapped from the RTL descriptions illustrated in FIG. 8 according to the blocks of the RTL descriptions, a circuit configuration is fixed in processing after this. In other words, for the group B, a fixing attribute is assigned so that logic circuit optimization is not performed.

The asynchronous circuit extraction unit 14 directs the logical data generator 11B to generate the logical data 32 having a logical expression such that the AND of the enable signal EN and the signal D0 is set as the hold value of the flip-flops, based on the above-mentioned constraint condition. Then, the logical data generator 11B generates the logical data 32 based on this constraint condition (at step S303).

Figure 15:
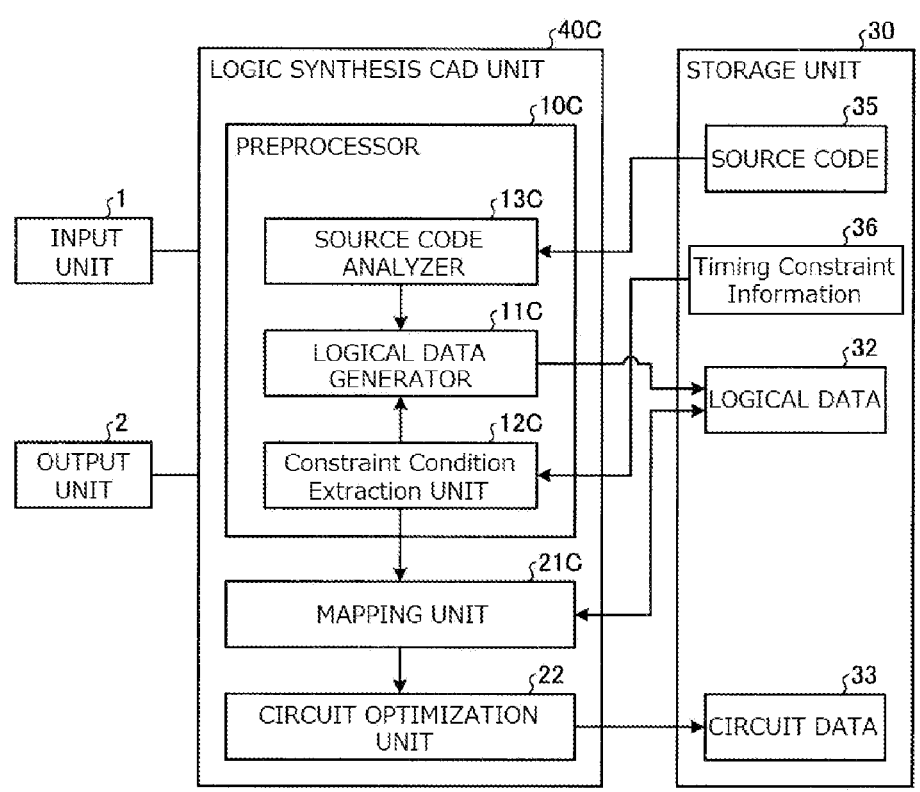
FIG. 15 is a diagram illustrating circuit data in the third embodiment.

Further, under a condition that an operation portion for the AND of the enable signal EN and the signal D0 be fixed as the AND gate 6, directed by the asynchronous circuit extraction unit 14, the mapping unit 21B performs mapping to transistor cell level, and the circuit optimization unit 22 performs optimization. In other words, as illustrated in FIG. 15, a logic circuit X to which the fixing attribute has been assigned at step S302 is fixed, the remaining portion is regarded as a perfect synchronous circuit, and logic optimization is performed from the viewpoint of speed, area, or power consumption, as has been conventional. As a result, as illustrated in FIG. 15, the circuit data 33 optimized with a circuit configuration in the portion X fixed is generated (at step S304).

Incidentally, in the mapping by the mapping unit 21B, when a technology library has an AND-OR/NAND-NOR cell, this cell can be directly mapped as designer's intended logic; however, the technology library may not have a desired cell. Even in such a case, it is finally necessary to select some cell present in the technology library. For example, in a case where a constraint condition as mentioned above is present, in the final circuit data 33, a cell to form combinational logic such that a glitch does not occur is selected. In other words, it becomes possible to prevent generation of a redundant logic circuit such that both a rise path and a fall path on the ending edge occur, from a change in rise or fall of a signal on the starting edge. For example, logic of A·B is formed of logic of A·(A'+B) according to the relationship A·B=A·(A'+B), and thereby, it becomes possible to prevent A·A' from causing the occurrence of both a rise path from A and a fall path of A'.

According to the third embodiment, the asynchronous circuit extraction unit 14 extracts an asynchronous circuit in which plural clocks occur together, from the logical data, thereby to set a constraint condition. Then, optimization of circuit data by the logic synthesis CAD is performed under the constraint condition. As a result, the circuit data which reflects the intent of design can be obtained.

[Fourth Embodiment]

Figure 16:
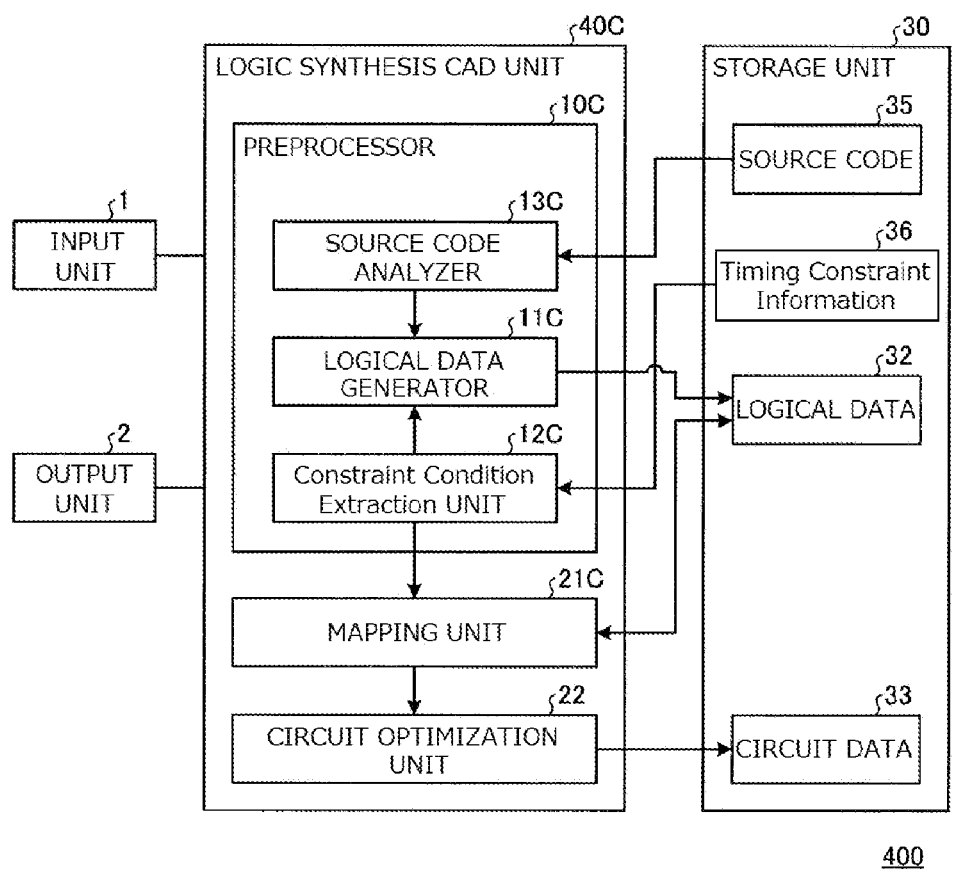
FIG. 16 is a drawing illustrating a configuration of a logic circuit design system according to a fourth embodiment.

Next, a logic circuit design method according to the fourth embodiment will be described with reference to FIG. 16. FIG. 16 is a drawing illustrating a configuration of a logic circuit design system 400 according to the fourth embodiment. In the fourth embodiment, a preprocessor 10C includes a source code analyzer 13C, a logical data generator 11C, and a constraint-condition extraction unit 12C. The source code 35 and the timing constraint information 36 correspond to the design data 31 of FIG. 1. A mapping unit 21C and the circuit optimization unit 22 correspond to the optimization unit 20 of FIG. 1 and have their respective functions which are the same as those of the second embodiment.

In the fourth embodiment, the contents of the source code 35 are illustrated in FIG. 17. It is a circuit illustrated in FIG. 18 that is intended by the designer who has written the source code 35. This circuit is configured as a multi-cycle path; specifically, anything will do, provided only that, for DATA1 [7:0] ([7:0] indicates 8 digits in total, from a 0-bit digit to a 7-bit digit, i.e. 8 bits of data) and DATA2[7:0] driven by CLK as a clock signal, an added result ADD_ANS[8:0] can be obtained by an adder 9 within two cycles of CLK after the instant when the values of DATA1[7:0] and DATA2[7:0] change. This is due to the fact that operation by the adder 9 is not finished within a cycle. Generally, an attempt to finish processing by an arithmetic unit within a cycle leads to an increase in circuit size. Therefore, when the adder 9 is implemented in proper circuit size, the operation is not finished within a cycle.

Figure 18:
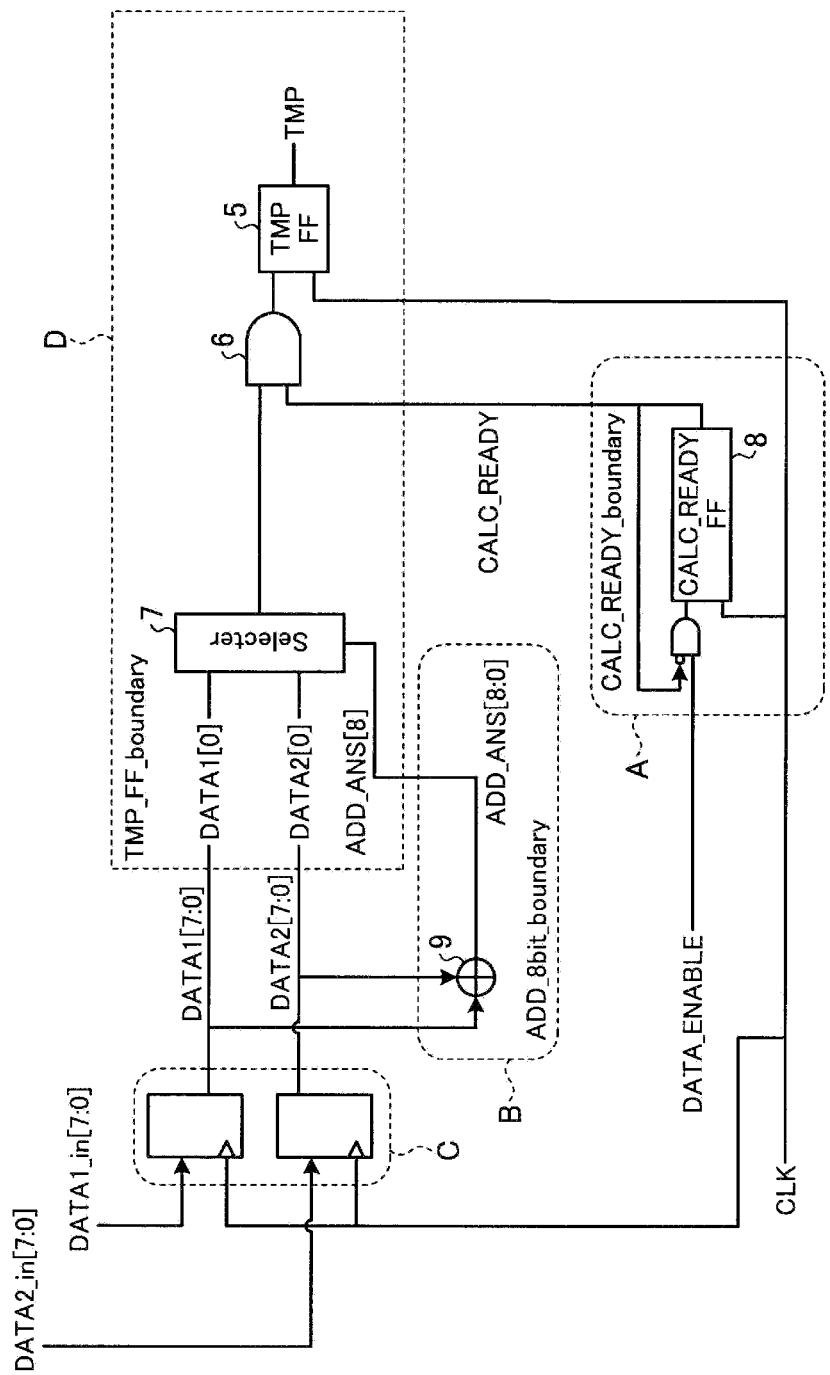
FIG. 18 is a diagram illustrating a designer's intended circuit configuration in the fourth embodiment.

Therefore, transfer of the output from the selector 7 to the flip-flop 5 is permitted by a computable signal CALC_READY which becomes "1" every two cycle of CLK. The computable signal CALC_READY is a signal which permits the transfer of the output from the selector 7 as a calculated result of DATA1 and DATA2 to the flip-flop 5. In other words, the circuit of FIG. 18 is a circuit to which a timing constraint on an output ADD_ANS[8] (or the eighth bit of ADD_ANS [8:0]) from the adder 9 as the multi-cycle path is applied by the computable signal CALC_READY inputted to the AND gate 6.

RTL description written with the intention of controlling the timing of the input signal to the flip-flop 5 by the computable signal CALC_READY is description of a block D of the source code illustrated in FIG. 17. Also in the fourth embodiment, it is therefore desired that cell mapping be performed so that the outermost nest ("if(CALC_READY==1'b1) begin" through "end" corresponding thereto) of if statement becomes the last stage of the circuit, as is the case with the third embodiment. However, the circuit of FIG. 18 has only one CLK as the clock signal, and therefore, even if the source code 35 is converted by the logical data generator 11C to partial logical data fragmented for each of groups and containing clock information, the extraction of a location to be fixed in the circuit from the logical data, like the third embodiment, is impossible. In the fourth embodiment, therefore, the timing constraint information 36 designating the above-mentioned timing constraint is applied in conjunction with the source code 35 to the preprocessor 10C.

Figure 19:
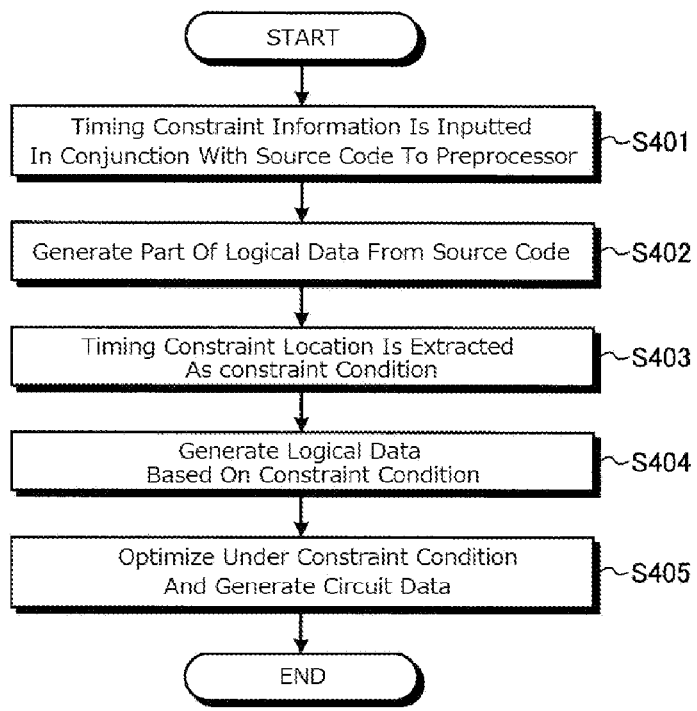
FIG. 19 is a drawing illustrating a flowchart of a logic circuit design method according to the fourth embodiment.

Next, the logic circuit design method according to the fourth embodiment will be described with reference to FIG. 19. FIG. 19 is a flowchart of the logic circuit design method by the logic circuit design system 400. First, the timing constraint information 36 is applied in conjunction with the source code 35 to the preprocessor 10C (at step S401). Specifically, the source code 35 is applied to the source code analyzer 13C, and the timing constraint information 36 is applied to the constraint-condition extraction unit 12C. Specific description of the timing constraint information 36 is description as given below, for example.

set_multicycle_path -through ADD_ANS[8:0]

Thereby, the output ADD_ANS[8:0] from the adder 9 as the multi-cycle path is designated.

Then, the source code 35 which has gone through the source code analyzer 13C is converted by the logical data generator 11C to logical data for each of fragmented portions for each of blocks (at step S402). Specifically, a block A of the RTL description of FIG. 17 is converted to a portion of the logical data corresponding to a group A of FIG. 18, and a block B of the RTL description of FIG. 17 is converted to a portion of the logical data corresponding to a group B of FIG. 18. A block C of the RTL description of FIG. 17 is converted to a portion of the logical data corresponding to a group C of FIG. 18, and the block D of the RTL description of FIG. 17 is converted to a portion of the logical data corresponding to a group D of FIG. 18. Incidentally, a block E of the RTL description of FIG. 17 has no correspondence with FIG. 18 because of defining a function of the adder for use in the block B.

Then, the constraint-condition extraction unit 12C extracts a timing constraint location as a constraint condition (at step S403). Specifically, a group of a logical expression in which the output ADD_ANS[8:0] from the adder 9 as the multi-cycle path is an input is extracted based on the above-mentioned timing constraint information 36. In other words, for a group of a logical expression corresponding to TMP_FF_ boundary represented by the group D of FIG. 18 in which ADD_ANS[8:0] is an input, an attribute is assigned so that after this the group is fixed so as not to undergo logic optimization.

The constraint-condition extraction unit 12C directs the logical data generator 11C to generate the logical data 32 having a logical expression such that the AND of the computable signal CALC_READY and the selector 7 is set as the hold value of the flip-flop 5, based on the above-mentioned constraint condition (at step S404).

Further, under a condition that an operation portion for the AND of the computable signal CALC_READY and the selector be fixed as the AND gate 6, directed by the constraint-condition extraction unit 12C, the mapping unit 21C performs mapping to transistor cell level, and the circuit optimization unit 22 performs optimization. In other words, the group D of FIG. 18 to which the fixing attribute has been assigned at step S403 is fixed, the remaining portion is regarded as a perfect synchronous circuit, and logic optimization is performed from the viewpoint of speed, area, or power consumption, as has been conventional. As a result, as illustrated in FIG. 18, the circuit data 33 optimized with a circuit configuration of TMP_FF_boundary of the group D fixed is generated (at step S405).

Incidentally, in the mapping by the mapping unit 21C, when a technology library has an AND-OR/NAND-NOR cell, this cell can be directly mapped as designer's intended logic; however, the technology library may not have a desired cell. Even in such a case, it is finally necessary to select some cell present in the technology library. In a case where a constraint condition as mentioned above is present, in the final circuit data 33, a cell to form combinational logic such that a glitch does not occur is selected. In other words, it becomes possible to prevent generation of a redundant logic circuit such that both a rise path and a fall path on the ending edge occur, from a change in rise or fall of a signal on the starting edge. For example, logic of A·B is formed of logic of A·(A'+B) according to the relationship A·B=A·(A'+B), and thereby, it becomes possible to prevent A·A' from causing the occurrence of both a rise path from A and a fall path of A'.

According to the fourth embodiment, a location where a signal for imposing a timing constraint on a multi-cycle path signal is inputted is applied as timing constraint information to the logic synthesis CAD. Optimization of circuit data by the logic synthesis CAD is performed under a constraint condition based on the constraint information. As a result, the circuit data which reflects the intent of design can be obtained.

Although several embodiments of the present invention have been described, it should be understood that these embodiments are illustrative and not intended to limit the scope of the invention, these novel embodiments may be otherwise variously embodied, various omissions, substitutions, and changes could be made hereto without departing from the spirit and scope of the invention, and these embodiments and modifications thereof may be included in the spirit and scope of the invention and in the scope of the following claims and equivalence thereof.

What is claimed is:

1. A computer-implemented method of generating a net list, the method comprising:
   generating logical data for each of portions corresponding to blocks of a register transfer level description relevant to operation of a gate logic circuit, accounting for an order of priority in the register transfer level description, based on a source code comprising the register transfer level description;
   generating one or more constraint conditions designating circuit data which satisfies a condition among a plurality of gate level circuit data logically equivalent to the logical data for each of the portions, based on the source code, the generating the one or more constraint conditions comprising setting a fixing attribute for at least one of the portions describing an AND logic operation on an asynchronous signal or a multi-cycle signal, and
   an enable signal or a select signal, the fixing attribute configured to exclude performance of optimization on the at least one of the portions; and
   generating the net list based on optimization of the logical data under the one or more constraint conditions including the fixing attribute,
   the method performed programmatically by a design system that comprises one or more computers.

2. The net list generating method of claim 1, wherein at least some of the source code indicates the one or more constraint conditions in the register transfer level description.

3. The net list generating method of claim 1, wherein
   the one or more constraint conditions comprise information on a location where a plurality of signals, each respectively driven by one of a plurality of different clocks, coexist together in the logical data for each of the portions, and
   the generating the net list generates the net list with the location excluded from a target for optimization.

4. The net list generating method of claim 1,
   wherein the source code comprises timing constraint information designating a multi-cycle path signal,
   the one or more constraint conditions comprise information on a location where the multi-cycle path signal is inputted in the logical data for each of the portions, and
   the generating the net list generates the net list with the location excluded from a target for optimization.

5. The net list generating method of claim 1, wherein the circuit data which satisfies the condition, designated by the one or more constraint conditions, is such that a signal designated by the one or more constraint conditions is inputted to a second logic circuit which outputs a signal to be inputted to a first logic circuit of the circuit data.

6. A non-transitory, computer-readable storage medium having stored thereon a net list generating program that, when executed by an electronic computer, causes the computer to execute functions comprising:
   generating logical data for each of portions corresponding to blocks of a register transfer level description relevant to operation of a gate logic circuit, accounting for an order of priority in the register transfer level description, based on source code comprising the register transfer level description;
   generating one or more constraint conditions designating circuit data which satisfies a condition among a plurality of gate level circuit data logically equivalent to the logical data for each of the portions, based on the source code, the generating the one or more constraint conditions comprising setting a fixing attribute for at least one of the portions describing an AND logic operation on an asynchronous signal or a multi-cycle signal, and
   an enable signal or a select signal the fixing attribute to configured to exclude performance of optimization on the at least one of the portions; and
   generating the net list based on optimization of the logical data under the one or more constraint conditions including the fixing attribute.

7. The storage medium of claim 6, wherein at least some of the source code indicates the one or more constraint conditions in the register transfer level description.

8. The storage medium of claim 6, wherein
   the one or more constraint conditions comprise information on a location where a plurality of signals, each respectively driven by one of a plurality of different clocks, coexist together in the logical data for each of the portions, and
   the generating the net list generates the net list with the location excluded from a target for optimization.

9. The storage medium of claim 6,
   wherein the source code comprises timing constraint information designating a multi-cycle path signal,
   the one or more constraint conditions comprise information on a location where the multi-cycle path signal is inputted in the logical data for each of the portions, and
   the generating the net list generates the net list with the location excluded from a target for optimization.

10. The storage medium of claim 6, wherein the circuit data which satisfies the condition, designated by the one or more constraint conditions, is such that a signal designated by the one or more constraint conditions is inputted to a second logic circuit which outputs a signal to be inputted to a first logic circuit of the circuit data.

11. A net list design system including one or more computing devices comprising:
   a logical data generator configured to generate logical data for each of portions corresponding to blocks of a register transfer level description relevant to operation of a gate logic circuit, accounting for an order of priority in the register transfer level description, based on source code comprising the register transfer level description;
   a constraint-condition unit configured to generate one or more constraint conditions designating circuit data which satisfies a condition among a plurality of gate level circuit data logically equivalent to the logical data for each of the portions, based on the source code, the one or more constraint conditions comprising a fixing attribute for at least one of the portions describing an AND logic operation on
      an asynchronous signal or a multi-cycle signal, and
      an enable signal or a select signal,
   the fixing attribute configured to inhibit performance of optimization on the at least one of the portions; and
   an optimization unit configured to generate the net list based on the logical data under the one or more constraint conditions including the fixing attribute.

12. The net list design system of claim 11, wherein at least some of the source code indicates the one or more constraint conditions in the register transfer level description.

13. The net list design system of claim 11, wherein
   the one or more constraint conditions comprise information on a location where a plurality of signals, each respectively driven by one of a plurality of different clocks, coexist together in the logical data for each of the portions, and
   the optimization unit generates the net list with the location excluded from a target for optimization.

14. The net list design system of claim 11, wherein the source code comprises timing constraint information designating a multi-cycle path signal,
   the one or more constraint conditions comprise information on a location where the multi-cycle path signal is inputted in the logical data for each of the portions, and
   the optimization unit generates the net list with the location excluded from a target for optimization.

15. The net list design system of claim 11, wherein the circuit data which satisfies the condition, designated by the one or more constraint conditions, is such that a signal designated by the one or more constraint conditions is inputted to a second logic circuit which outputs a signal to be inputted to a first logic circuit of the circuit data.

* * * * *